United States Defensive Publication [19] (H) [11] T966,009

Gardineer, Jr. et al. [43] Jan. 3, 1978

[54] STATIC FREE FLUID BEARING TRACK SYSTEM

[75] Inventors: Bayard G. Gardineer, Jr., Patterson; Stanley A. Manning, Yorktown Heights; Arthur E. Meeks, Woodstock; Bela Musits, Wappingers Falls, all of N.Y.

[73] Assignee: International Business Machines Corporation, Armonk, N.Y.

[21] Appl. No.: 800,151

[22] Filed: May 24, 1977

Related U.S. Application Data

[63] Continuation of Ser. No. 676,600, April 13, 1976, abandoned.

[51] Int. Cl.[2] ..... B65G 51/02

[52] U.S. Cl. ..... 302/2 R; 302/31; 361/215

[57] ABSTRACT

An improved fluid bearing track structure in which the metal surface of the track is enclosed by a transparent envelope having the inner surface coated with a transparent metal film which is grounded with the metal track surface to prevent static buildup.

1 Claim, 1 Sheet Drawing,

8 Pages Specification

The file of this unexamined application may be inspected and copies thereof may be purchased (849 O.G. 1221, Apr. 9, 1968).

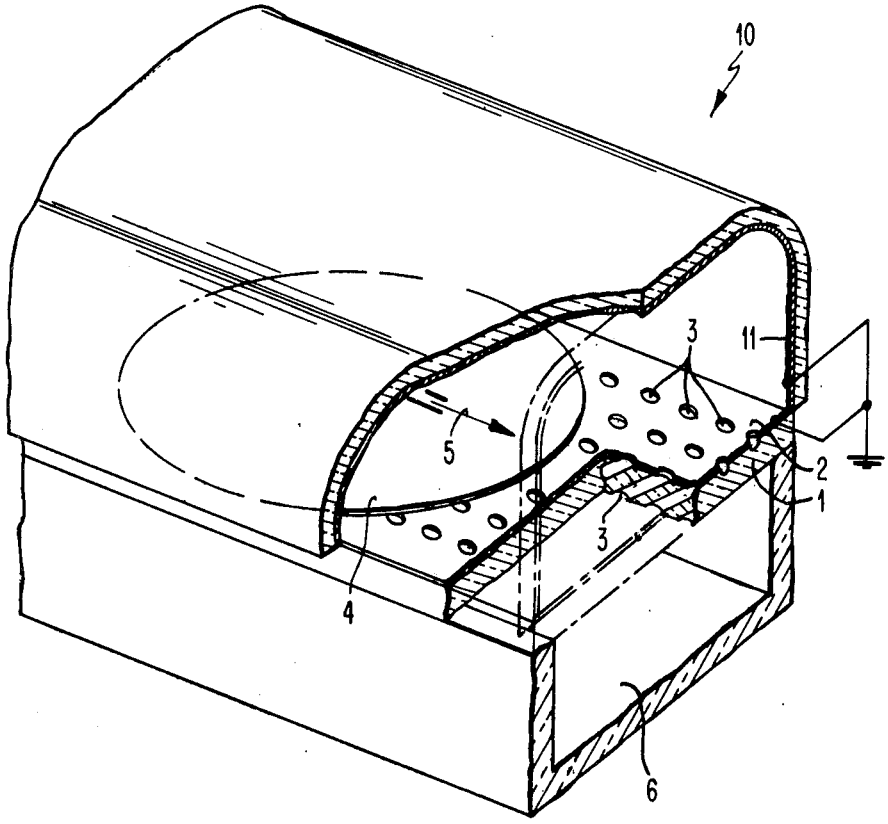

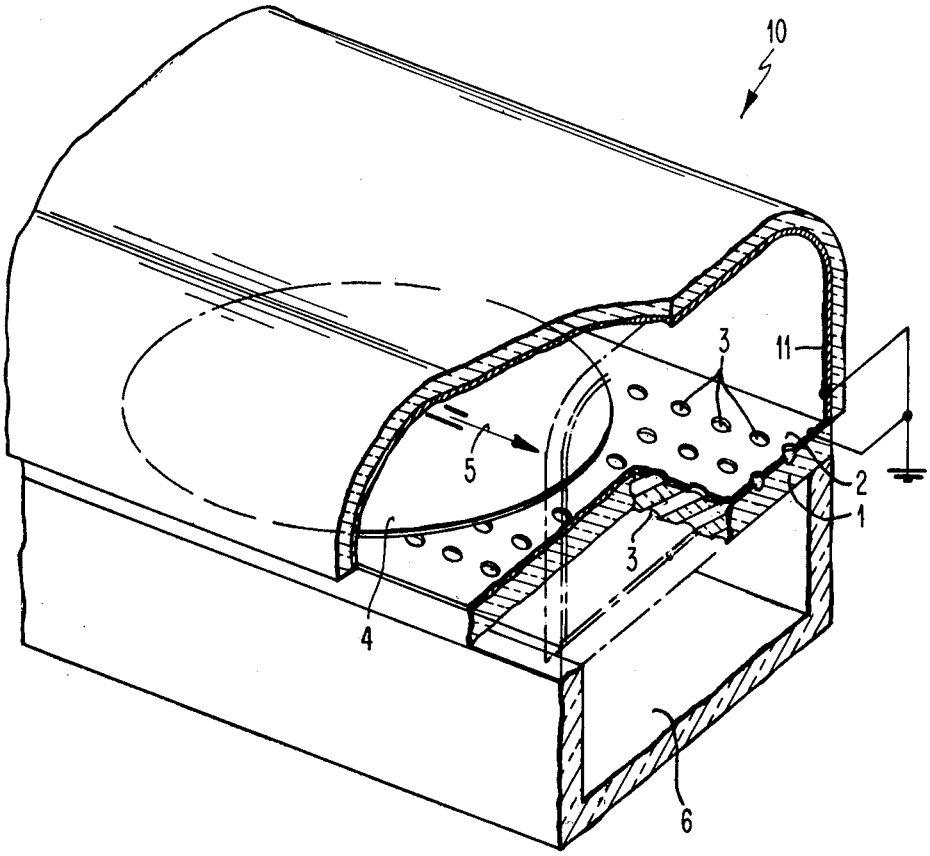
10
3
11
5
2
1
3
4
6